(12) United States Patent
Chow et al.

(10) Patent No.: US 7,596,864 B2
(45) Date of Patent: Oct. 6, 2009

(54) STACKED MODULE CONNECTOR

(75) Inventors: John Chow, Saratoga, CA (US); Huan Chen, Kunshan (CN); Chih-Min Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 365 days.

(21) Appl. No.: 11/724,461

(22) Filed: Mar. 15, 2007

(65) Prior Publication Data
US 2008/0222887 A1 Sep. 18, 2008

(51) Int. Cl.
*B23K 1/12* (2006.01)
*H05K 3/42* (2006.01)
*H05K 3/34* (2006.01)

(52) U.S. Cl. ............................ 29/852; 29/842; 29/829; 29/854; 29/830; 29/843; 228/51; 228/49.1; 228/49.5; 228/179.1; 228/180.5; 228/245; 228/262; 174/261

(58) Field of Classification Search ................... 29/860, 29/852, 840, 830, 843; 174/261; 228/51, 228/55, 19, 20, 179.1–180.5, 245–262
See application file for complete search history.

(56) References Cited

U.S. PATENT DOCUMENTS 4,484,054 A 11/1984 Morino

*Primary Examiner*—Derris H Banks
*Assistant Examiner*—Dan D Le
(74) *Attorney, Agent, or Firm*—Wei Te Chung

(57) ABSTRACT

A method for soldering a soft wire to a printed circuit board conveniently includes the following step: providing a bracket having a through hole and an enameled wire; fastening the enameled wire to the bracket with the conductive wire crossing over the through hole; providing a printed circuit board formed with conductive pads thereon and setting the printed circuit board onto the bracket with the pad aligned to the through hole so that a portion of the magnet wire crossing the through hole lies on the conductive pad; providing a soldering tool having a thermal contact portion and inserting the thermal contact portion into the through hole to solder the magnet wire to the conductive pad.

17 Claims, 10 Drawing Sheets

STACKED MODULE CONNECTOR

BACKGROUND OF THE INVENTION

1. Field of the Invention

The present invention relates to a method for soldering a soft wire to a printed circuit board, and more particularly, relates to a method for soldering a magnet wire to a printed circuit board used for an electrical connector.

2. Description of the Prior Art

A high speed method of soldering insulated wire lying across a terminal pad of a circuit board coated with solder melting using a soldering tool is disclosed by Ronald in U.S. Pat. No. 4,484,054. The method includes the following steps: (a) selecting the effective mass of the soldering tool so that the quantum of heat energy stored therein when heated to a preselected high temperature is only slightly in excess of that required to vaporize insulation off the wire and to create an effective solder joint of solder melting at about 450.degree. F.; (b) heating the soldering tool of the selected mass to a preselected high temperature close to, but below, the temperature which would cause rapid deterioration of the tool; (c) bringing the soldering tool into contact with the insulated wire while lying across the solder coated terminal pad; (d) the quantum of heat energy in the tool being just sufficient (i) to vaporize insulation on the wire in the area of the contact point, (ii) to then vaporize the insulation on the side of the wire opposite to the contact point, and (iii) to then melt the solder on the solder coated terminal pad; (e) the quantum of heat energy being insufficient to permit significant heat migration into the circuit board or other components beyond the terminal pad; and (f) the total contact time for making the solder joint being less than 500 milliseconds.

Furthermore, a method to position the insulated wire across the terminal pad of a circuit board is also disclosed by above-mentioned Ronald patent. As shown in FIG. 1 of the Ronald patent, a circuit board is mounted for movement by an X-Y transport and is moved from point-to-point according to a computer control. A wire guide unit, scribing stylus and soldering tool are mounted above the circuit board so they can rotate as a unit. Insulated copper wire is fed through the wire guide toward stylus which presses the wire into the tacky surface coating on the circuit board as is best seen in FIG. 2 thereof. The rotational position of the scribing unit (including wire guide, stylus, and soldering tool) is determined in accordance with the direction of the table movement so that the wire is laid down on the board surface as the board moves away from the scribing unit.

However, this method needs much higher cost in equipments, such as a computer control. Furthermore, the wire guide and the stylus are not suited to position such a magnet wire that has a diameter even less than a hair.

Hence, a new method for soldering a soft wire to a printed circuit board conveniently is needed to solve the above problems.

BRIEF SUMMARY OF THE INVENTION

One object of the present invention is to provide a method for soldering a soft wire to a printed circuit board conveniently through an auto soldering tool.

A new method for soldering a soft wire to a printed circuit board conveniently is provided in the present invention. The method comprises the following step: providing a bracket defined with a through hole; providing a magnet wire; fastening said magnet wire to said bracket with said conductive wire crossing the through hole; providing a printed circuit board formed with a conductive pad thereon; setting said printed circuit board onto said bracket with said pad aligned to said through hole so that a portion of the magnet wire crossing the through hole lies on the conductive pad; providing a soldering tool having a thermal contact portion; inserting said thermal contact portion into the through hole solder the magnet wire to the conductive pad.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Figure 1:
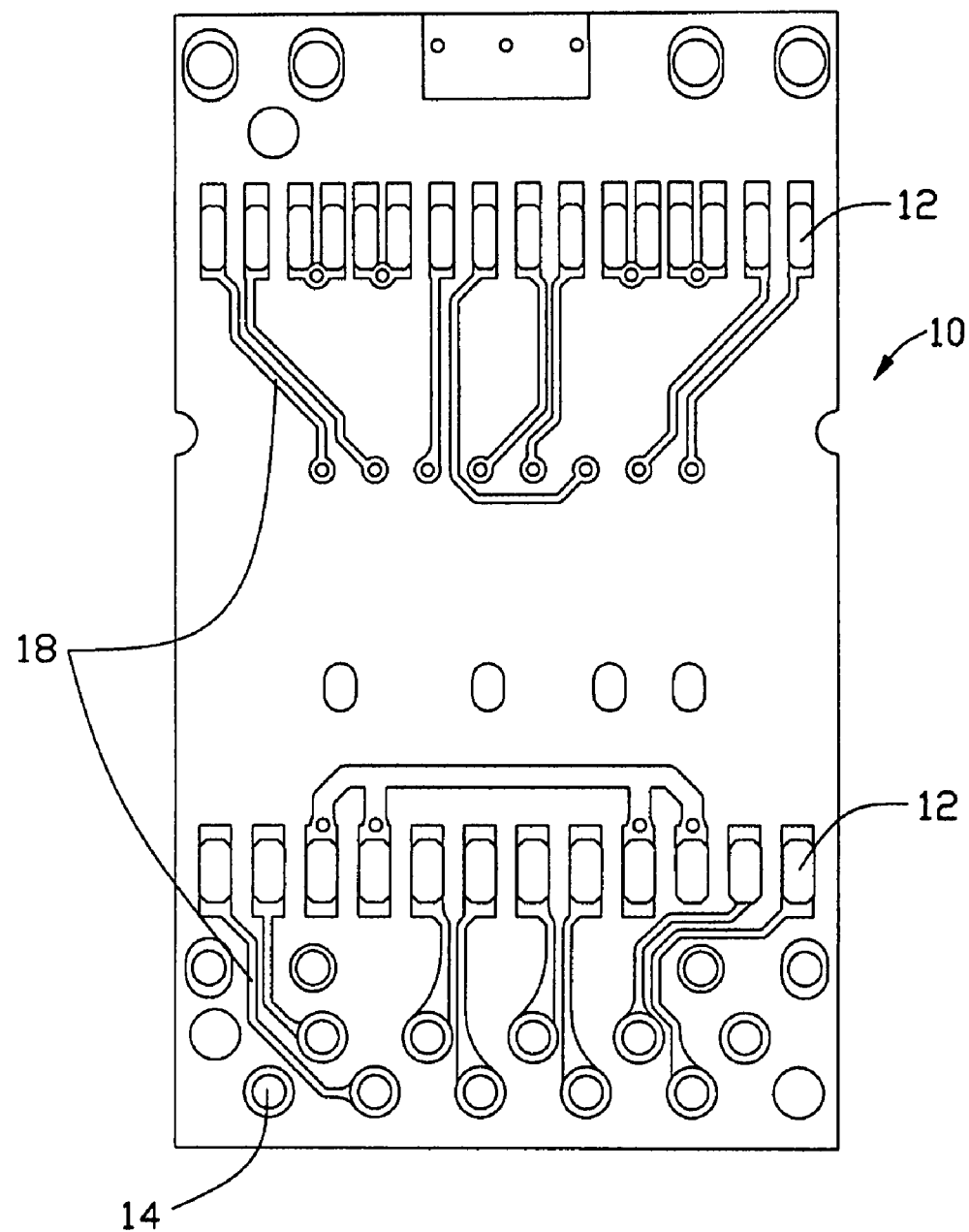
FIG. 1 is a first side view of a printed circuit board according to an embodiment of the present invention.

Reference will now be made to the drawing figures to describe the present invention in detail.

Figure 2:
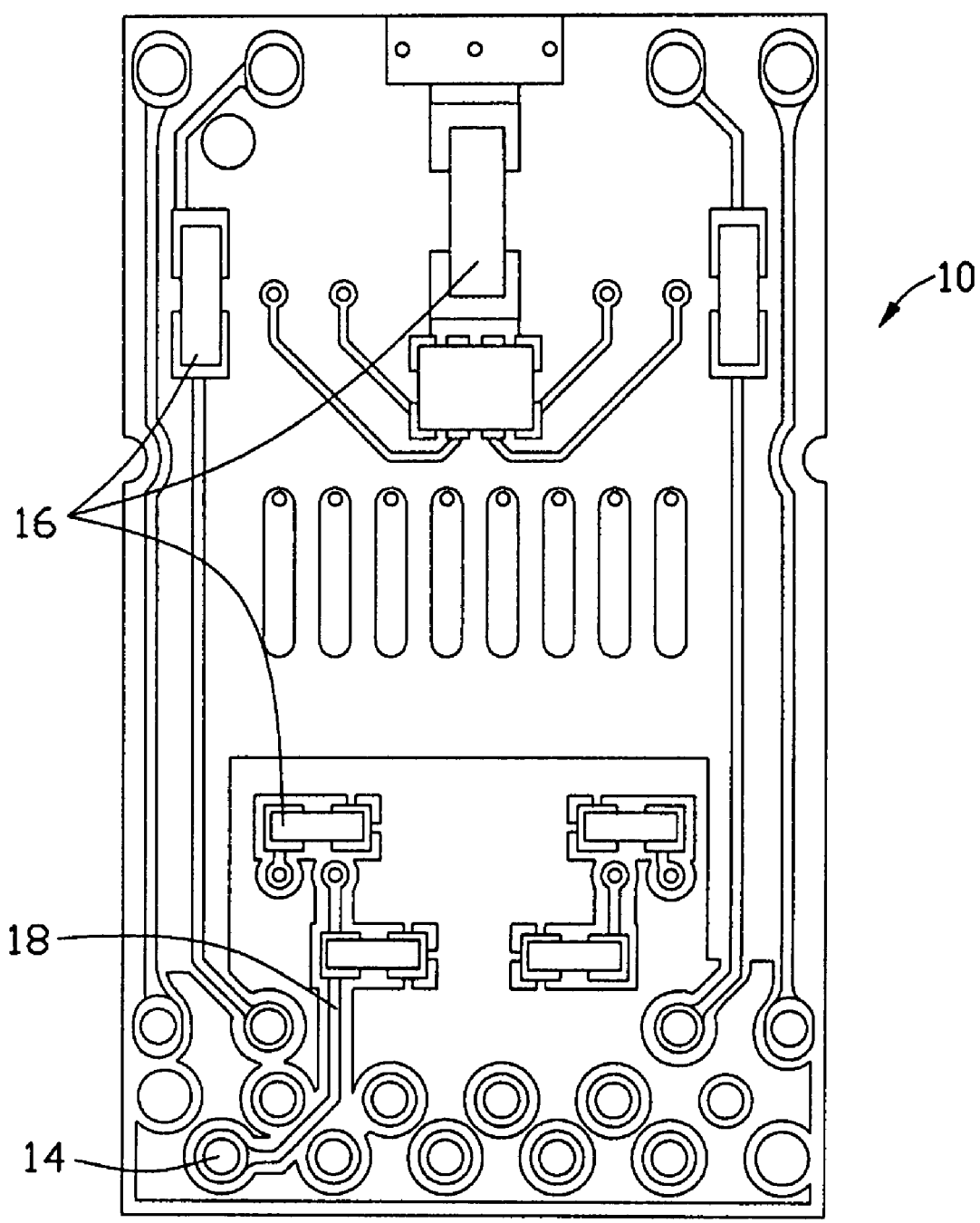
FIG. 2 is a second side view of the printed circuit board shown in FIG. 1.

FIGS. 1 and 2 show a printed circuit board 10 used for the present invention. FIG. 1 shows a first side of the printed circuit board 10 on which a number of conductive pads 12 are arrayed in two lines parallel to each other. Each of the conductive pads 12 is shaped in a rectangle having a length of about 1.2 millimeters and a width of about 0.6 millimeters, the length oriented perpendicular to the parallel lines. Outside the two parallel lines of conductive pads 12, the printed circuit board 10 defines two lines of conductive through holes 14 for a number of conductive contacts (not shown) mounted therein. FIG. 2 shows a second side of the printed circuit board 10 opposite to the first side. A number of passive components 16 are located thereon. The printed circuit board 10 further defines a number of conductive paths 18 electrically connecting the conductive through holes 14, the conductive pads 12 and the passive components 16.

Figure 3:
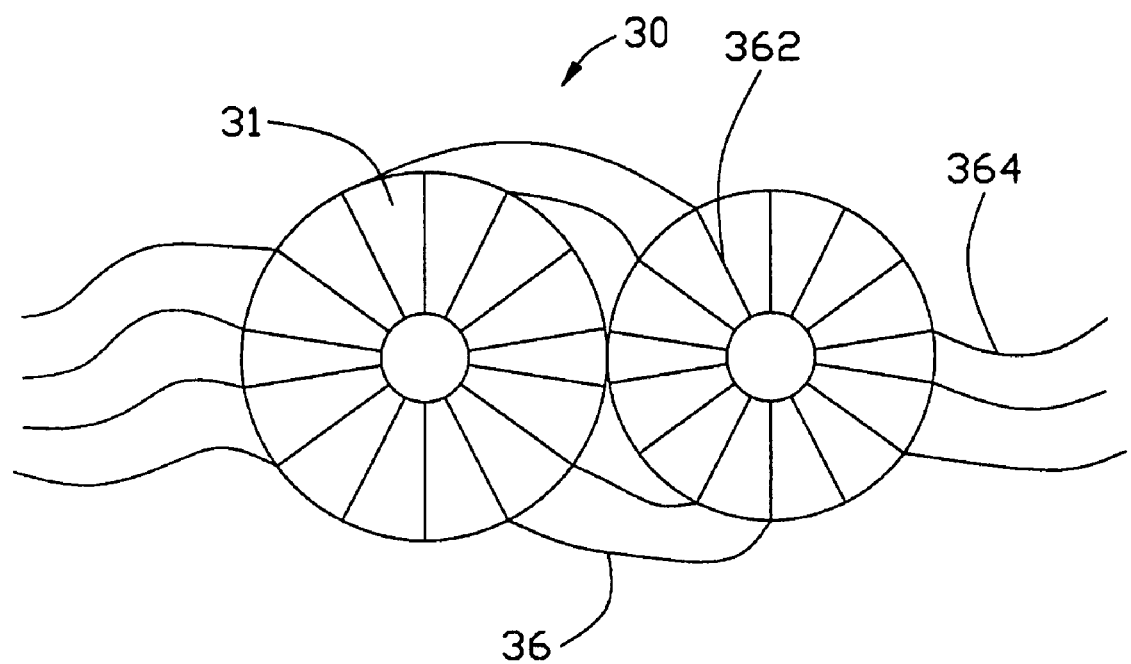
FIG. 3 is a side view of a pair of wire cores according to an embodiment of the present invention.
Figure 4:
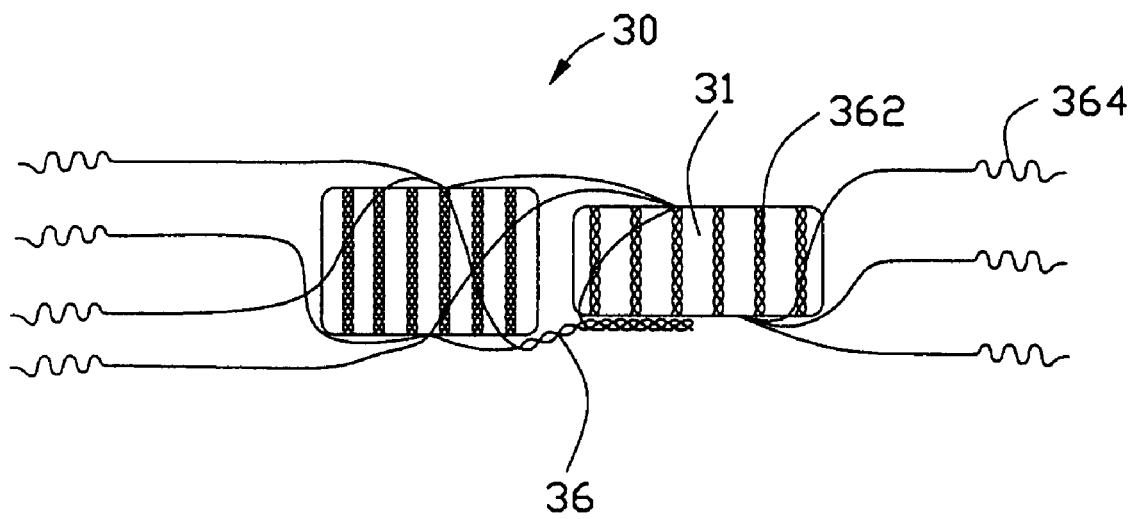
FIG. 4 is a top view of the pair of wire cores shown in FIG. 3.

FIGS. 3 and 4 show a top view and a side view of a pair of coils 30. Each of the coils 30 includes an iron core 31 and several magnet wires 36 having center portions 362 winding around the iron core 31 and free ends 364.

Figure 5:
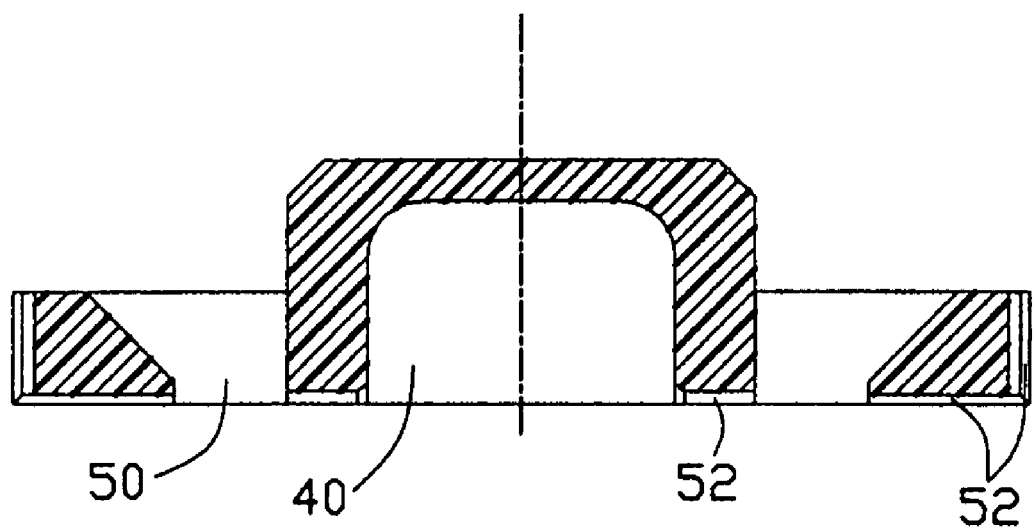
FIG. 5 is a sectional view of a bracket according to an embodiment of the present invention.
Figure 6:
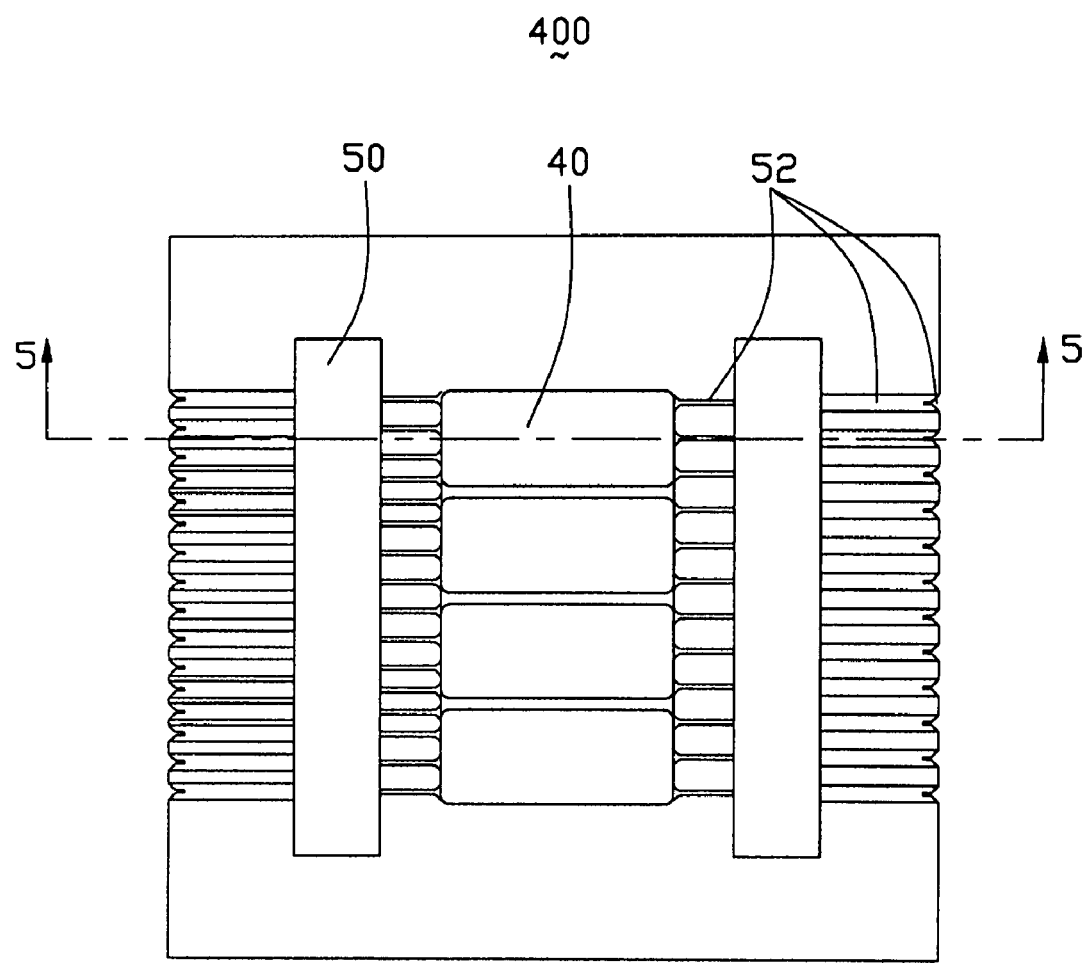
FIG. 6 is a bottom view of the bracket shown in FIG. 5.
Figure 7:
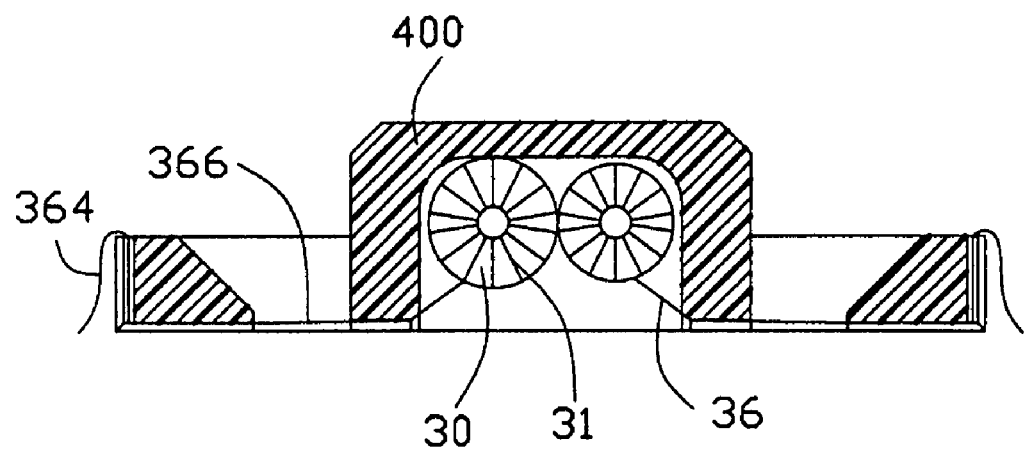
FIG. 7 is a sectional view of the bracket with the pair of wire cores received therein.
Figure 8:
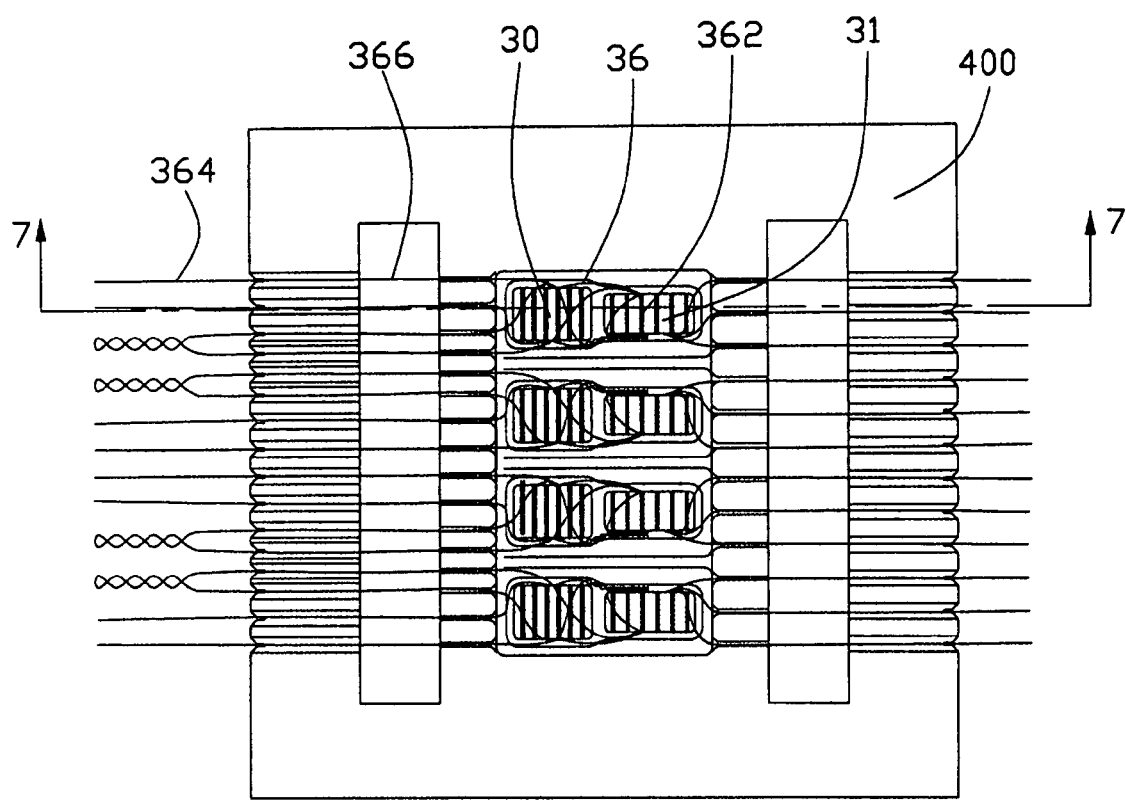
FIG. 8 is a bottom view of the bracket with the pair of wire cores received therein.
Figure 9:
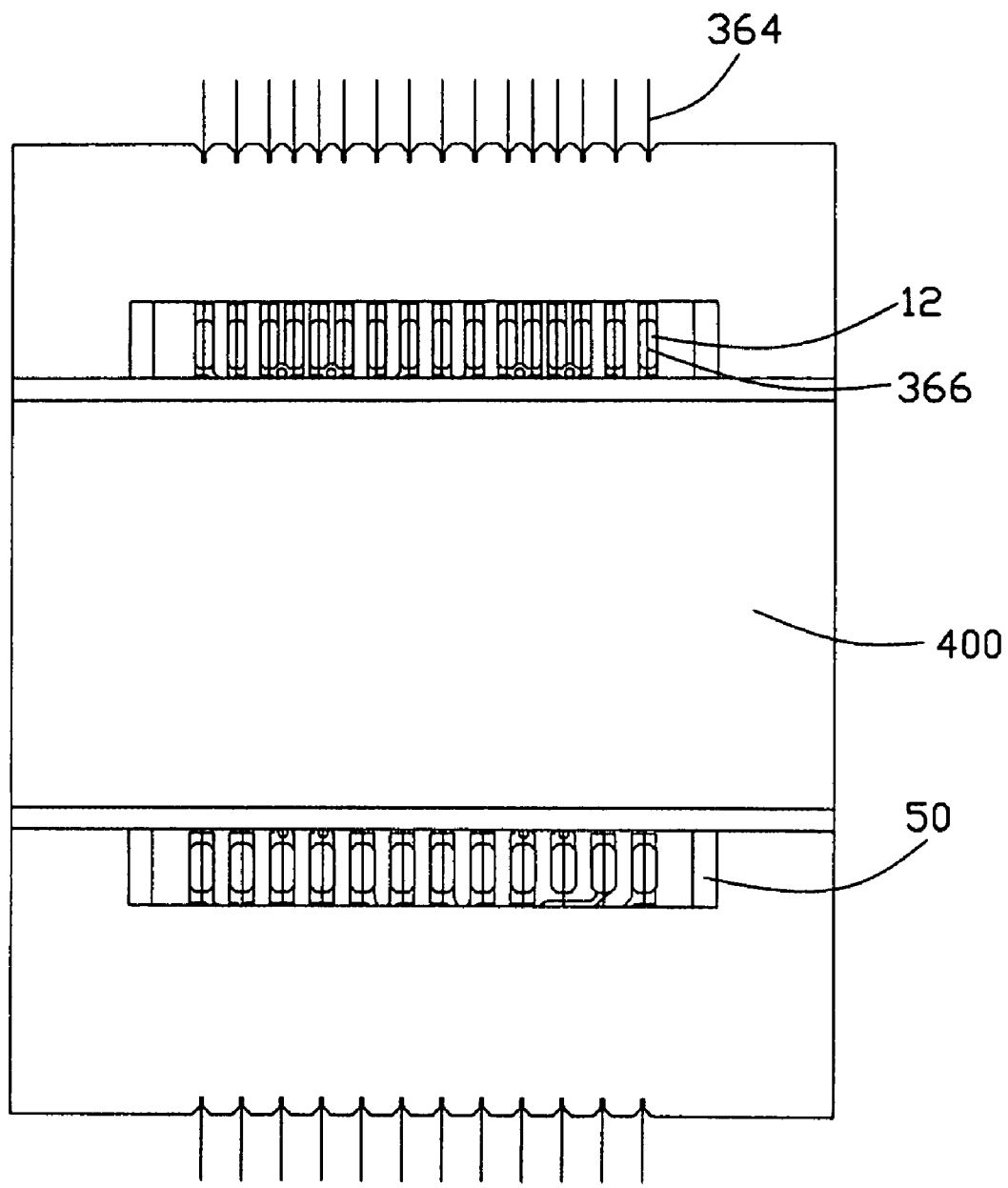
FIG. 9 is a top view of the bracket with the pair of wire cores received therein and the printed circuit board mounted thereon.

FIGS. 5 and 6 show a side view and a bottom view of a loading tool 400. The loading tool 400 is shaped in a bracket defined with four cavities 40 for receiving four pairs of coils 30 therein and two through holes 50 in two opposite sides of the cavities 40. Each of the through holes 50 is elongate and two opposite sides of the through hole 50 are defined with a number of slots 52 parallel to each other and perpendicular to a longitudinal direction of the through hole 50.

Figure 10:
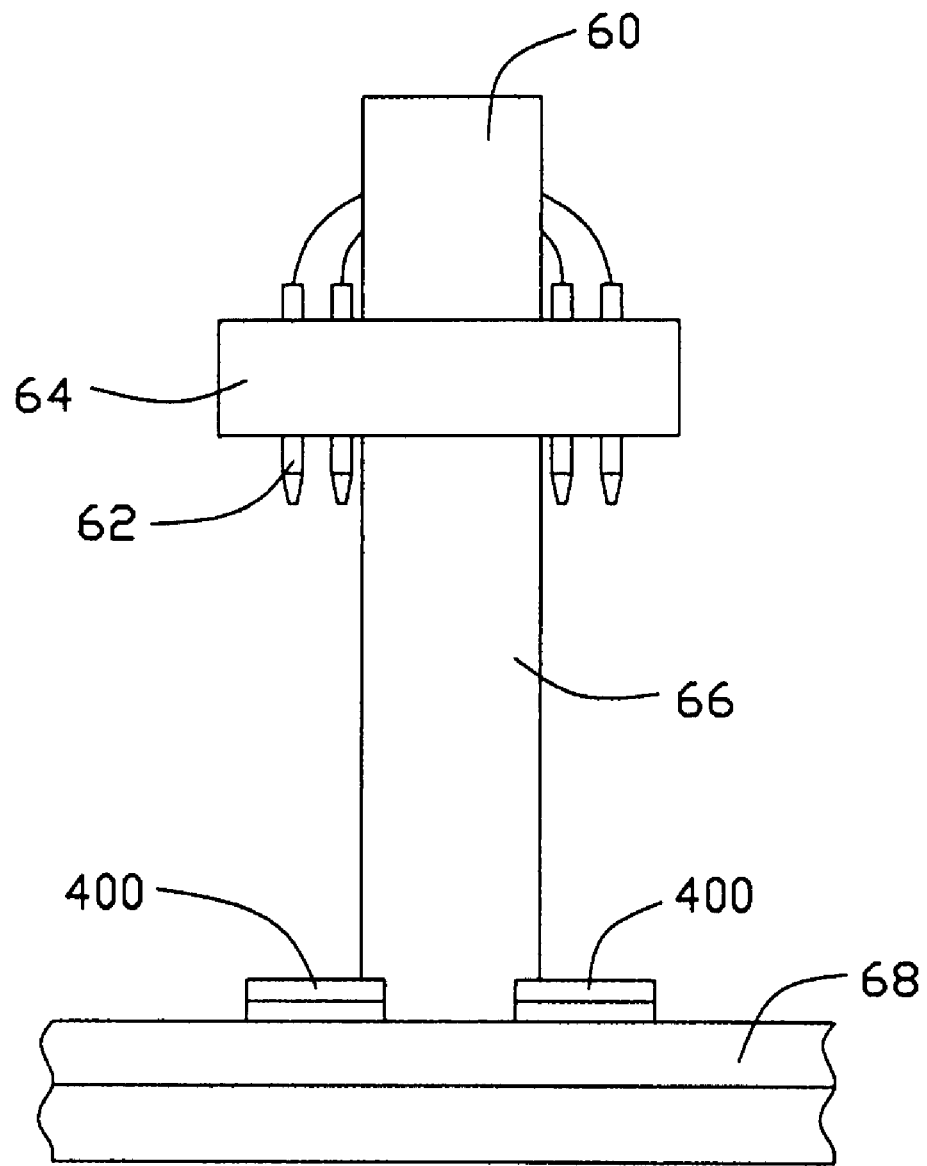
FIG. 10 is a sketch view of an auto-soldering tool with the bracket placed on a guiding track.

An auto-soldering tool 60 is shown in FIG. 10. The soldering tool includes four thermal contact portions 62 fasten to a platform 64 movable vertically. Each of the four thermal contact portions 62 forms a horizontal rectangle lower end face that has a width of about 0.59 millimeters and a length of about 0.6 millimeters. The auto-soldering tool 62 further includes a vertical post 66 supporting the platform 64 and a guiding track 68 along which the bracket could horizontally slide. The guiding track 68 forms positioning means (not shown) for positioning the bracket 60 in different positions where different thermal contacts 62 are aligned.

A method for firmly soldering four pairs of coils 30 to the printed circuit board 10 includes the following steps: providing the bracket 400, four pairs of coils 30, printed circuit board 10 and soldering tool 60 as described above; placing the iron cores 31 into the cavities 40 of the bracket 400; pulling the free ends 362 of the magnet wires 36 into the slots 52 beside the through hole 50 so that a portion 366 of the magnet wire 36 crosses the through hole 50 and then fastening them to the bracket 400; setting the printed circuit board 10 onto the bracket 400 with the parallel lines of the conductive pads 12 aligned to corresponding through holes 50 and the portion 366 of each the conductive wire 36 lying on the corresponding conductive pad 12; placing the bracket 400 together with the printed circuit board 10 and the pairs of magnet wires 30 on the horizontal guiding track 68 and sliding them to a pausing position so that a pair of thermal contact portions 62 of the soldering tool 60 are aligned with two of the conductive pads 12 of the printed circuit board 10; inserting the thermal contact portions 62 into the through holes 50 of the bracket 400 to solder the magnet wires 36 to the conductive pads 12; taking out the printed circuit board 10 soldered with the pairs of coils 30 from the bracket 400 and getting rid of the free ends 364 of the magnet wire 36; finally, manually re-soldering the magnet wire 36 to the conductive pad 12.

It is, to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

We claim:

1. A method for soldering a magnet wire to a printed circuit board comprising:
   providing a bracket defined with a through hole;
   providing a magnet wire;
   fastening said magnet wire to said bracket with said conductive wire crossing the through hole;
   providing a printed circuit board formed with a conductive pad thereon;
   setting said printed circuit board onto said bracket with said pad aligned to said through hole so that a portion of the magnet wire crossing the through hole lies on the conductive pad;
   providing a soldering tool having a thermal contact portion;
   inserting said thermal contact portion into the through hole and soldering the magnet wire to the conductive pad.

2. The method according to claim 1 wherein the wire is wound around an iron core to form a coil.

3. The method according to claim 2 further comprising a step of taking out the printed circuit board together with the coil from the bracket.

4. The method according to claim 3 further comprising a step of getting rid of the free ends of the soft wire.

5. The method according to claim 4 further comprising a step of manually re-soldering the wire to the conductive pad.

6. A method for soldering a plurality of magnet wires to a printed circuit board comprising:
   providing a bracket defined with a cavity and two through holes on two opposite sides of said cavity;
   providing a plurality of magnet wires having center portions wound around an iron core and ends left free;
   placing the iron core into the cavity;
   fastening said free ends of the magnet wires to said bracket so that portions of the magnet wires cross the through holes;
   providing a printed circuit board with a plurality of conductive pads formed thereon;
   setting said printed circuit board onto said bracket with said pads aligned to corresponding through holes so that portions of the conductive wires crossing the corresponding through holes lie on the corresponding conductive pads;
   providing a soldering tool having a plurality of thermal contact portions;
   inserting said thermal contact portions into the through holes and soldering the conductive wires to corresponding conductive pads.

7. The method according to claim 6 wherein the conductive pads are located along two parallel lines, and wherein the two through holes of bracket are elongate and parallel to each other and aligned with said parallel lines of conductive pads.

8. The method according to claim 6 wherein the bracket comprises a line of slots and the step of fastening comprises interference fitting said free ends of the magnet wires with said slots.

9. The method according to claim 6 further comprising a step of taking out the printed circuit board together with the magnet wires from the bracket.

10. The method according to claim 9 further comprising a step of getting rid of the free ends of the soft wire.

11. The method according to claim 10 further comprising a step of manually re-soldering the conductive wire to the conductive pad.

12. The method according to claim 6 wherein the soldering tool includes a horizontal guiding track along which the bracket together with the printed circuit board are sliding and pausing at predetermined soldering positions for soldering.

13. The method according to claim 12 wherein the thermal contact portions are movable up and down along a vertical line to align with each through hole at corresponding soldering position.

14. A method for soldering a magnet wire to a printed circuit board comprising:
   providing a bracket with a through opening;
   providing a magnet wire;
   installing said magnet wire to said bracket with said magnet wire crossing the through opening;
   providing a printed circuit board formed with a conductive pad thereon;
   seating the bracket unto said printed circuit board with said conductive pad exposed to an exterior via said through opening under a condition that a portion of the magnet wire is exposed to the exterior via the through opening and is aligned with and lies on the conductive pad; and soldering said portion of the magnet wire to the conductive pad.

15. The method as claimed in claim 14, wherein some other portion of the magnet wire is retained to the bracket to result in a somewhat tensioned manner of said magnet wire for assuring alignment between the magnet wire and the corresponding conductive pad.

16. The method as claimed in claim 15, wherein means is formed on the bracket to hold many of said magnet wire in a predetermine pitch so as to comply with that of many of said conductive pad formed on the printed circuit board.

17. The method as claimed in claim 15, wherein said means defines a plurality of grooves formed on an undersurface of the bracket.

\* \* \* \* \*